(12) United States Patent
Murakami et al.

(10) Patent No.: US 10,290,749 B2
(45) Date of Patent: May 14, 2019

(54) SOLAR CELL MODULE AND SOLAR CELL

(71) Applicant: Panasonic Intellectual Property Management Co., Ltd., Osaka (JP)

(72) Inventors: Youhei Murakami, Osaka (JP); Kenji Ikeda, Shiga (JP)

(73) Assignee: Panasenlc Intellectual Property Management Co., Ltd., Osaka (JP)

(*) Notice: Subject to any disclaimer, the term of this patent is extended or adjusted under 35 U.S.C. 154(b) by 0 days.

(21) Appl. No.: 15/271,224

(22) Filed: Sep. 21, 2016

(65) Prior Publication Data

US 2017/0012141 A1    Jan. 12, 2017

Related U.S. Application Data

(63) Continuation of application No. PCT/JP2014/082398, filed on Dec. 8, 2014.

(30) Foreign Application Priority Data

Mar. 24, 2014    (JP) ................................ 2014-060093

(51) Int. Cl.
  *H01L 31/02* (2006.01)
  *H01L 31/05* (2014.01)
  *H01L 31/0224* (2006.01)

(52) U.S. Cl.
  CPC .. *H01L 31/0201* (2013.01); *H01L 31/022433* (2013.01); *H01L 31/022441* (2013.01);
  (Continued)

(58) Field of Classification Search
  CPC ..... H01L 31/022433; H01L 31/022441; H01L 31/022458; H01L 31/05; H01L 31/0516; H01L 31/0201
  See application file for complete search history.

(56) References Cited

U.S. PATENT DOCUMENTS

2013/0000715 A1* 1/2013 Moslehi ......... H01L 31/022441
                                                136/256
2013/0276859 A1   10/2013 Mishima
(Continued)

FOREIGN PATENT DOCUMENTS

JP    2010-147107 A    7/2010
JP    2012-138545 A    7/2012
(Continued)

OTHER PUBLICATIONS

Hsiao et al., Backsheet metallization of IBC silicon solar cells, IEEE 2013.*

(Continued)

*Primary Examiner* — Matthew T Martin
(74) *Attorney, Agent, or Firm* — Metrolexis Law Group, PLLC (57) ABSTRACT

A solar cell includes: a first bus bar electrode disposed on a first end portion of the solar cell, and to which the wiring member is connected; a second bus bar electrode disposed on a second end portion of the solar cell, and to which the wiring member is connected; first finger electrodes disposed on the solar cell, electrically connected to the first bus bar electrode, and extending in a first direction toward the second bus bar electrode; second finger electrodes disposed on the solar cell, electrically connected to the second bus bar electrode, and extending in a second direction toward the first bus bar electrode. Each first finger electrode has a thickness which decreases as a distance to the second bus bar electrode decreases, and each second finger electrode has a thickness which decreases as a distance to the first bus bar electrode decreases.

11 Claims, 5 Drawing Sheets

(52) U.S. Cl.
CPC ...... *H01L 31/022458* (2013.01); *H01L 31/05* (2013.01); *H01L 31/0516* (2013.01); *Y02E 10/50* (2013.01)

(56) References Cited

U.S. PATENT DOCUMENTS

| | | |
|---|---|---|
| 2014/0102508 A1 | 4/2014 | Ishii |
| 2014/0158180 A1* | 6/2014 | Ishii ................ H01L 31/022441 136/244 |

FOREIGN PATENT DOCUMENTS

| | | | |
|---|---|---|---|
| JP | 2013-201282 A | 10/2013 | |
| WO | WO-2013031296 A1 * | 3/2013 | ..... H01L 31/022441 |
| WO | 2013-046324 A1 | 4/2013 | |
| WO | 2013-005475 A1 | 10/2013 | |

OTHER PUBLICATIONS

International Search Report (ISR) dated Feb. 24, 2015 for PCT Application No. PCT/JP2014/082398.

* cited by examiner

SOLAR CELL MODULE AND SOLAR CELL

CROSS REFERENCE TO RELATED APPLICATIONS

This application is a U.S. continuation application of PCT International Patent Application Number PCT/JP2014/082398 filed on Dec. 8, 2014, claiming the benefit of priority of Japanese Patent Application Number 2014-060093, filed on Mar. 24, 2014, the entire contents of which are hereby incorporated by reference.

TECHNICAL FIELD

The present disclosure relates to a solar cell module and a solar cell.

BACKGROUND ART

Since a back contact solar cell requires no electrode on the light receiving surface, high-output characteristics are expected. On the back surface of the back contact solar cell, generally, finger electrodes and bus bar electrodes connected to the finger electrodes are provided. In a solar cell module including back contact solar cells, as disclosed in International Publication No. WO2013/005475 (Patent Literature (PTL) 1), for example, different conductivity type bus bar electrodes of adjacent solar cells are electrically connected by a wiring member.

SUMMARY

The solar cell module including the back contact solar cells is requested for further improvement on the output characteristics. In proximity to the bus bar electrodes to which the wiring member is connected, the tips of the finger electrodes of different conductivity types are located. Therefore, when the wiring member is connected to the bus bar electrodes, the wiring member may contact the finger electrodes, resulting in a short circuit.

An object of the present disclosure is to provide a solar cell module and a solar cell each of which is capable of improving the output characteristics of the solar cell module including back contact solar cells, and preventing, when a wiring member is connected to the bus bar electrodes, the wiring member from contacting the finger electrodes and resulting in a short circuit.

The solar cell module according to an aspect of the present invention is a solar cell module including: a plurality of solar cells each having a light receiving surface and a back surface; and a wiring member which electrically connects the plurality of solar cells. Each of the plurality of solar cells includes: a first bus bar electrode which is disposed on a first end portion of the back surface of the solar cell, and to which the wiring member is connected; a second bus bar electrode which is disposed on a second end portion of the back surface of the solar cell, and to which the wiring member is connected; a plurality of first finger electrodes disposed on the back surface of the solar cell, electrically connected to the first bus bar electrode, and extending in a first direction toward the second bus bar electrode; a plurality of second finger electrodes disposed on the back surface of the solar cell, electrically connected to the second bus bar electrode, and extending in a second direction toward the first bus bar electrode. The plurality of first finger electrodes and the plurality of second finger electrodes are alternately disposed in a direction substantially perpendicular to the first direction and the second direction. Each of the plurality of first finger electrodes has a thickness which decreases as a distance to the second bus bar electrode decreases, and each of the plurality of second finger electrodes has a thickness which decreases as a distance to the first bus bar electrode decreases.

The solar cell according to an aspect of the present invention is a solar cell having a light receiving surface and a back surface. The solar cell includes: a first bus bar electrode disposed on a first end portion of the back surface; a second bus bar electrode disposed on a second end portion of the back surface; a plurality of first finger electrodes disposed on the back surface, electrically connected to the first bus bar electrode, and extending in a first direction toward the second bus bar electrode; and a plurality of second finger electrodes disposed on the back surface, electrically connected to the second bus bar electrode, and extending in a second direction toward the first bus bar electrode. The plurality of first finger electrodes and the plurality of second finger electrodes are alternately disposed in a direction substantially perpendicular to the first direction and the second direction. Each of the plurality of first finger electrodes has a thickness which decreases as a distance to the second bus bar electrode decreases, and each of the plurality of second finger electrodes has a thickness which decreases as a distance to the first bus bar electrode decreases.

Accordingly, it is possible to improve the output characteristics of the solar cell module, and it is also possible to prevent, when the wiring members are connected to the bus bar electrodes, the wiring members from contacting the finger electrodes and resulting in a short circuit.

BRIEF DESCRIPTION OF THE DRAWINGS

The figures depict one or more implementations in accordance with the present teaching, by way of examples only, not by way of limitations. In the figures, like reference numerals refer to the same or similar elements.

DETAILED DESCRIPTION

Embodiment

Hereinafter, an embodiment will be described. However, the following embodiment is merely an example, and does not limit the scope of the present disclosure. Moreover, in the drawings, elements having essentially the same functions may share like reference numbers.

Figure 1:
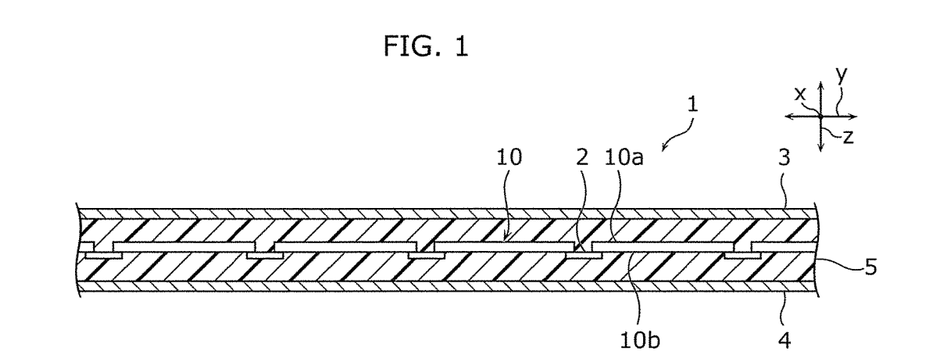
FIG. 1 is a schematic cross-sectional view of a solar cell module according to an embodiment.

FIG. 1 is a schematic cross-sectional view of a solar cell module according to the present embodiment. As FIG. 1 illustrates, a solar cell module 1 includes a plurality of solar cells 10. The solar cells 10 are disposed between a first protective member 3 located at the light receiving surface side and a second protective member 4 located at the back surface side. A filler layer 5 is provided between the first protective member 3 and the second protective member 4. The solar cells 10 are sealed by the filler layer 5.

The first protective member 3 may be made of, for example, a member having light-transmitting properties such as a glass substrate and a resin substrate. The second protective member 4 may be made of, for example, a resin sheet, resin sheets with a metal foil interposed therebetween, a glass substrate, or a resin substrate. The filler layer 5 may be made of, for example, resin such as ethylene-vinyl acetate copolymer (EVA), polyvinyl butyral (PVB), polyethylene (PE), and polyurethane (PU).

In the solar cell module 1, the solar cells 10 are arranged in a y-direction. Each solar cell 10 has a light-receiving surface 10a and a back surface 10b. The solar cells 10 are electrically connected by wiring members 2 disposed on the back surface 10b side.

Figure 2:
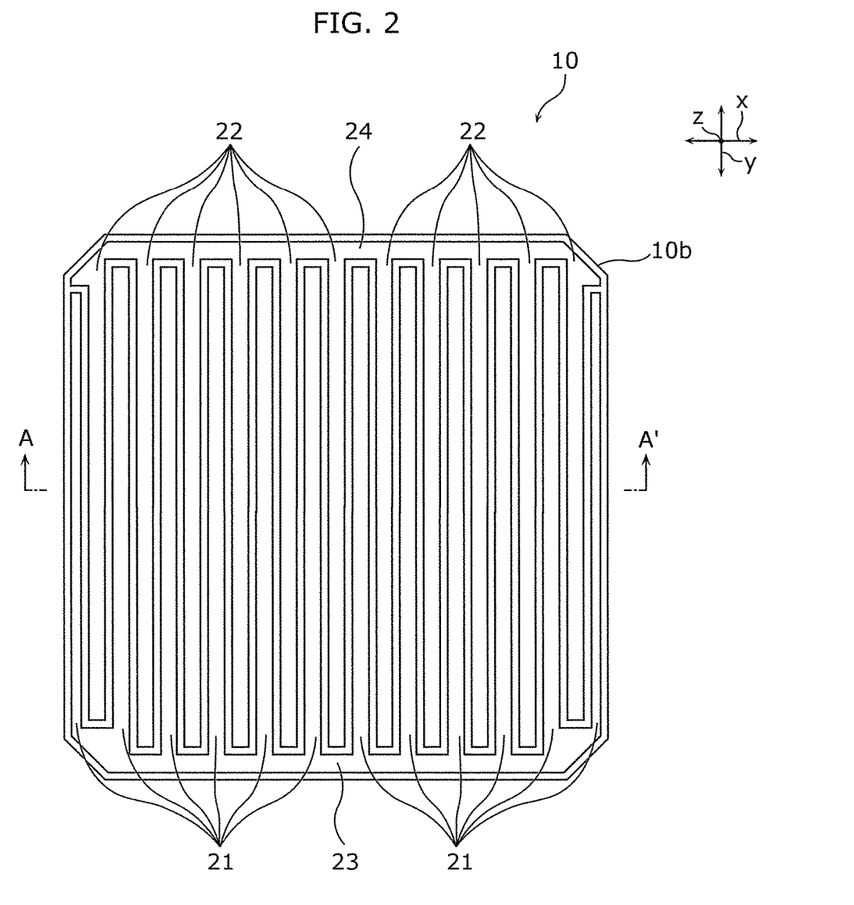
FIG. 2 is a schematic plan view of a back surface of a solar cell in the solar cell module according to the embodiment.

FIG. 2 is a schematic plan view of the back surface of a solar cell in the solar cell module according to the present embodiment. As FIG. 2 illustrates, a first bus bar electrode 23 is provided on a first end portion of the back surface 10b of the solar cell 10. A second bus bar electrode 24 is provided on a second end portion of the back surface 10b of the solar cell 10. A plurality of first finger electrodes 21 extending toward the second bus bar electrode 24 are electrically connected to the first bus bar electrode 23. A plurality of second finger electrodes 22 extending toward the first bus bar electrode 23 are electrically connected to the second bus bar electrode 24. The first finger electrodes 21 and the second finger electrodes 22 are alternately arranged in the direction (x-direction) which is substantially perpendicular to the direction (y direction) in which the first finger electrodes 21 and the second finger electrodes 22 extend. Thus, the first finger electrodes 21 and the second finger electrodes 22 are provided in a teeth-of-a-comb fashion.

Figure 3:
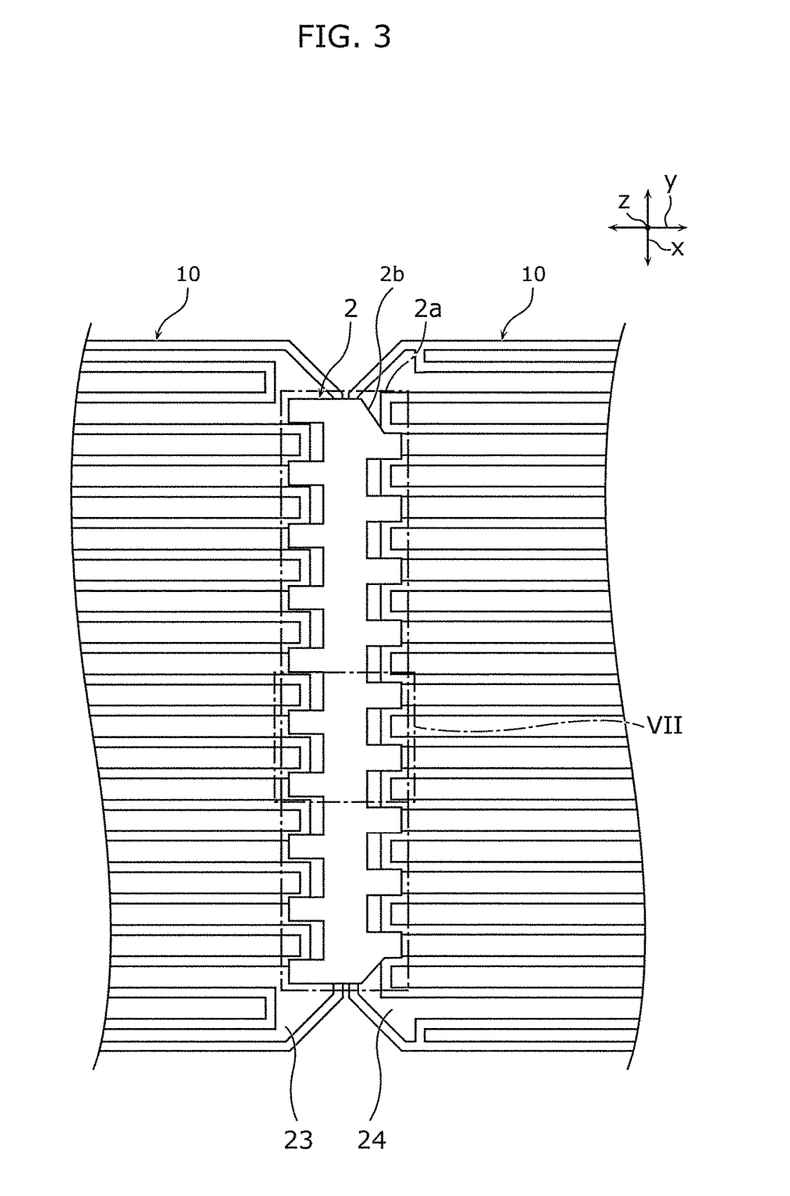
FIG. 3 is a schematic plan view of a connection state between solar cells in the solar cell module according to the embodiment.

FIG. 3 is a schematic plan view of a connection state between the solar cells in the solar cell module according to the present embodiment. As FIG. 3 illustrates, the first bus bar electrode 23 and the second bus bar electrode 24 of adjacent solar cells 10 are electrically connected by the wiring member 2. The wiring member 2 is similar to the wiring member used in the embodiment of PTL 1. The wiring member 2 includes an insulating substrate 2a, and a line 2b disposed on the insulating substrate 2a. A connection between the wiring member 2 and the first and second bus bar electrodes 23 and 24 will be described in detail later.

Figure 4:
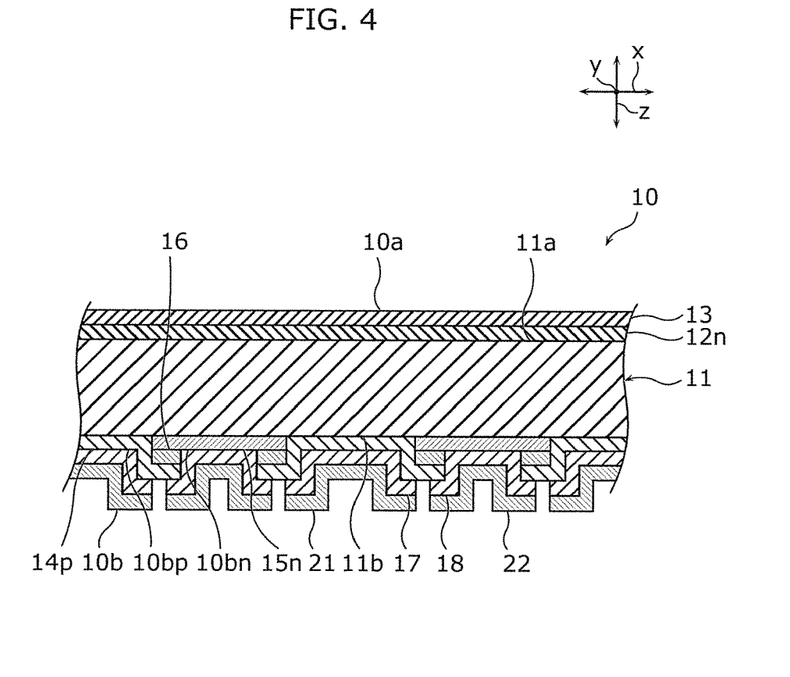
FIG. 4 is a schematic cross-sectional view taken along line A-A' of the solar cell illustrated in FIG. 2.

FIG. 4 is a schematic cross-sectional view taken along line A-A' of the solar cell illustrated in FIG. 2. As FIG. 4 illustrates, the solar cell 10 includes a substrate 11. The substrate 11 is made of a semiconductor material. The substrate 11 may be made of, for example, a crystalline semiconductor such as crystalline silicon. The substrate 11 has one conductivity type. Specifically, in the present embodiment, an example will be described where the conductivity type of the substrate 11 is an n-type.

A semiconductor layer 12n made of a semiconductor of an n-type which is the same conductivity type as the substrate 11 is disposed on a first major surface 11a of the substrate 11 positioned on the light-receiving surface 10a side. The semiconductor layer 12n substantially covers the entirety of the first major surface 11a. The semiconductor layer 12n may be made of, for example, an n-type amorphous silicon. The thickness of the semiconductor layer 12n may range, for example, from 1 nm to 10 nm approximately.

A semiconductor layer may be provided between the semiconductor layer 12n and the first major surface 11a. For example, the semiconductor layer may be made of a substantially intrinsic i-type semiconductor and have a thickness ranging from a few Å to 250 Å approximately which does not substantially contribute to power generation.

The surface of the semiconductor layer 12n further from the substrate 11 has an antireflection layer 13 having a function of reducing reflection and having a function as a protective film. The light receiving surface 10a of the solar cell 10 is formed by the antireflection layer 13. The antireflection layer 13 may be, for example, made of silicon nitride. The thickness of the antireflection layer 13 may be appropriately set according to, for example, the wavelength of light whose reflection is to be reduced. The thickness of the antireflection layer 13 may range, for example, from 50 nm to 200 nm approximately.

A semiconductor layer 14p, made of a semiconductor of a p-type which is a different conductivity type from that of the substrate 11, is provided on a portion of a second major surface 11b of the substrate 11. A semiconductor layer 15n, made of a semiconductor of n-type which is the same conductivity type as that of the substrate 11, is provided on at least a portion of the second major surface 11b of the substrate 11 where the semiconductor layer 14p is not provided. In the present embodiment, the entirety of the second major surface 11b is substantially covered with the semiconductor layer 14p and the semiconductor layer 15n. The semiconductor layer 14p and the semiconductor layer 15n may be made of, for example, p-type amorphous silicon and n-type amorphous silicon, respectively.

The semiconductor layer 14p forms a p-type surface 10bp. The semiconductor layer 15n forms an n-type surface 10bn.

The thickness of the semiconductor layer 14p may range, for example, from 2 nm to 20 nm approximately. The thickness of the semiconductor layer 15n may range, for example, from 5 nm to 50 nm approximately. A semiconductor layer may be provided between the semiconductor layer 14p and the second major surface 11b. For example, the semiconductor layer may be made of a substantially intrinsic i-type semiconductor, and have a thickness, for example, ranging from a few Å to 250 Å approximately which does not substantially contribute to power generation. In a similar manner, a semiconductor layer may be provided between the semiconductor layer 15n and the second major surface 11b. The semiconductor layer may be made of a substantially intrinsic i-type semiconductor, and have a thickness, for example, ranging from a few Å to 250 Å approximately which does not substantially contribute to power generation. A semiconductor layer made of a substantially intrinsic i-type semiconductor may be made of, for example, amorphous silicon.

The end portion of the semiconductor layer 14p in the x-axis direction overlaps the semiconductor layer 15n in the thickness direction z. An insulating layer 16 is provided between the end portion of the semiconductor layer 14p and the semiconductor layer 15n. The insulating layer 16 may be made of, for example, silicon nitride or silicon oxide.

A p-side seed layer 17 is provided on the semiconductor layer 14p. The p-side seed layer 17 has a function as a seed for forming the first finger electrodes 21 by a plating process. The p-side seed layer 17 is also formed in the region of the first bus bar electrode 23 illustrated in FIG. 2. The p-side seed layer 17 in the above region has a function as a seed for forming the first bus bar electrodes 23 by a plating process.

On the other hand, an n-side seed layer 18 is provided on the semiconductor layer 15n. The n-side seed layer 18 has a function as a seed for forming the second finger electrodes 22 by a plating process. The n-side seed layer 18 is also formed in the region of the second bus bar electrode 24 illustrated in FIG. 2. The n-side seed layer 18 in the above region has a function as a seed for forming the second bus bar electrode 24 by a plating process.

Figure 5:
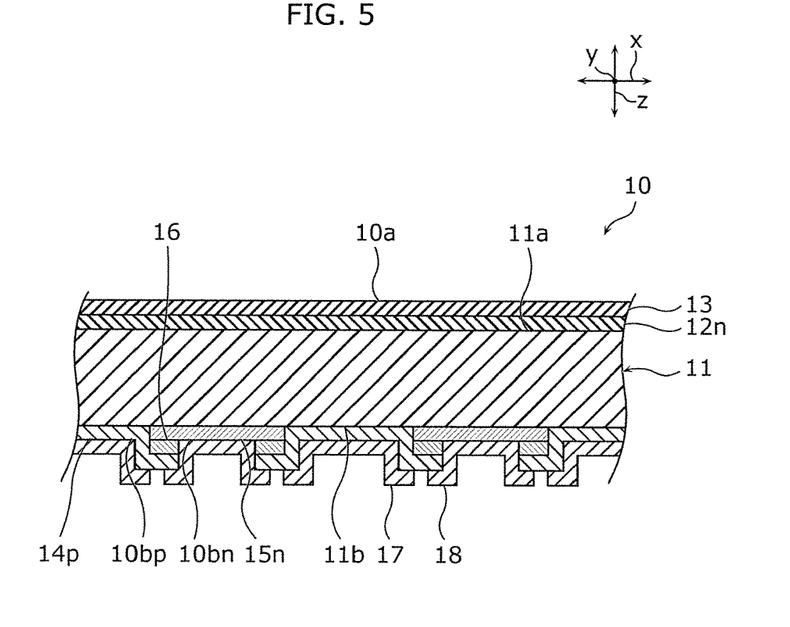
FIG. 5 is a schematic cross-sectional view illustrating a state before first and second finger electrodes are formed in the solar cell illustrated in FIG. 4.

FIG. 5 is a schematic cross sectional view illustrating a state before the first and second finger electrodes are formed in the solar cell illustrated in FIG. 4. The p-side seed layer 17 formed in the region of the first bus bar electrode 23 and the n-side seed layer 18 formed in the region of the second bus bar electrode 24 illustrated in FIG. 2 are each connected to a cathode used in electroplating. Then the electroplating is performed and the first and second finger electrodes 21 and 22 and the first and second bus bar electrodes 23 and 24 are formed.

Figure 6:
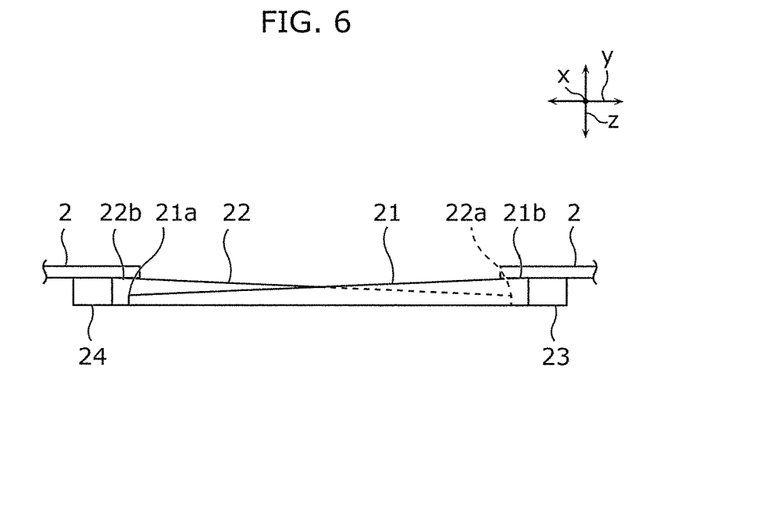
FIG. 6 is a schematic side view of the first and second finger electrodes and first and second bus bar electrodes in the solar cell according to the embodiment.

FIG. 6 is a schematic side view of the first and second finger electrodes and the first and second bus bar electrodes in the solar cell according to the present embodiment. FIG. 6 illustrates a state where the wiring member 2 is connected between the first bus bar electrode 23 and the second bus bar electrode 24 of adjacent solar cells 10.

As illustrated in FIG. 6, the first finger electrode 21 has a thickness which decreases as the distance to the second bus bar electrode 24 decreases. That is, the first finger electrode 21 has a tapered shape in which the thickness decreases from a base portion 21b toward a tip portion 21a. In a similar manner, the second finger electrode 22 has a thickness which decreases as the distance to the first bus bar electrode 23 decreases. That is, the second finger electrode 22 has a tapered shape in which the thickness decreases from a base portion 22b toward a tip portion 22a. The width of the first finger electrode 21 and the width of the second bus bar electrode 24 (the width in the x-direction) are substantially constant in the direction (y-direction) in which the first finger electrode 21 and the second bus bar electrode extend, unlike the thickness of the first finger electrode 21 and the second bus bar electrode (the thickness in the z-direction).

As described above, the tapered shape can be formed by, during the electroplating, connecting a cathode to the p-side seed layer 17 in the region of the first bus bar electrode 23 and a cathode to the n-side seed layer 18 in the region of the second bus bar electrode 24. That is, such a cathode connection increases the internal resistance of the p-side seed layer 17 from the base portion 21b toward the tip portion 21a in the formation of the first finger electrode 21. For this reason, the amount of electric conduction at the time of plating decreases from the base portion 21b toward the tip portion 21a. As a result, the thickness of the first finger electrode 21 decreases from the base portion 21b toward the tip portion 21a. For the same reason, the thickness of the second finger electrode 22 also decreases from the base portion 22b toward the tip portion 22a.

Figure 7:
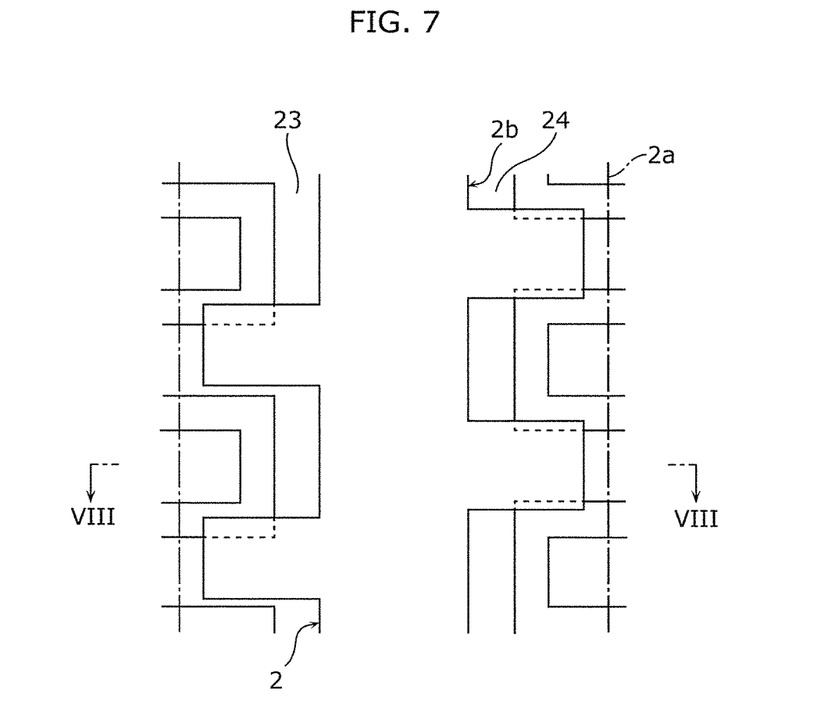
FIG. 7 is a schematic plan view of an enlarged portion VII illustrated in FIG. 3.
Figure 8:
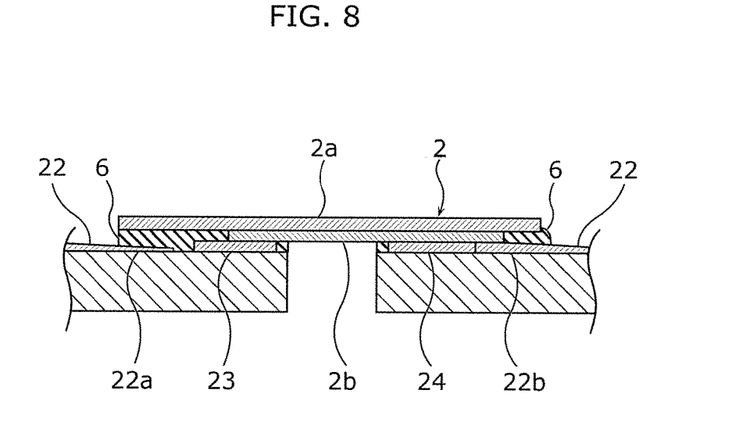
FIG. 8 is a schematic cross-sectional view taken along line VIII-VIII in FIG. 7

FIG. 7 is a schematic plan view of an enlarged portion VII illustrated in FIG. 3. FIG. 8 is a schematic cross-sectional view taken along line VIII-VIII in FIG. 7. As illustrated in FIG. 8, the wiring member 2 according to the present embodiment has an insulating substrate 2a, and a line 2b disposed on the insulating substrate 2a. The insulating substrate 2a may be flexible. The insulating substrate 2a may be made of, for example, an insulating material such as resin and ceramic. The wiring member 2b may be made of, for example, a metal such as Cu, Al, and Ag, or an alloy containing at least one of these metals.

The wiring member 2 is bonded to the solar cells 10 by an adhesive layer 6 illustrated in FIG. 8. The adhesive layer 6 may contain, for example, a cured product of a resin adhesive. The adhesive layer 6 may be made of a cured product of a resin adhesive, or may contain a cured product of a resin adhesive and conductive particles dispersed in the cured product.

In the present embodiment, the first finger electrode 21 has a tapered shape in which the thickness decreases from the base portion 21b toward the tip portion 21a. From the viewpoint of carrier collection, more carriers need to be collected from the tip portion 21a toward the base portion 21b. Therefore, the resistance value of the first finger electrode 21 may be decreased from the tip portion 21a toward the base portion 21b.

In the present embodiment, since the thickness of the first finger electrode 21 increases from the tip portion 21a toward the base portion 21b, the resistance value at the base portion 21b can be decreased. Accordingly, the output characteristics can be improved. In the first finger electrode 21, the resistance value of the tip portion 21a need not be decreased compared to the base 21b, and thus, the thickness of the first finger electrode 21 can be decreased at the tip portion 21a. Therefore, it is possible to reduce the materials for forming the first finger electrodes 21, leading to cost reduction.

The advantageous effects of the first finger electrodes 21 have been described above. Similar advantageous effects can also be obtained for the second finger electrodes 22.

As illustrated in FIG. 8, the following advantageous effects are obtained in the case where the adhesive layer 6 is bonded to the base portion 22b of the second finger electrode 22. That is, since the second finger electrode 22 has a tapered shape, as compared to the case where the second finger electrode 22 does not have a tapered shape, the area of adhesion between the adhesive layer 6 and the second finger electrode 22 can be increased. Similar advantageous effects can also be obtained in the adhesion between the adhesive layer 6 and the base portion 21b of the first finger electrode 21.

In the present embodiment, as illustrated in FIG. 6, the height of the tip portion 21a of the first finger electrode 21 is less than the height of the second bus bar electrode 24. In a similar manner, the height of the tip portion 22a of the second finger electrode 22 is less than the height of the first bus bar electrode 23. Accordingly, when the wiring member 2 is connected to the first bus bar electrode 23 and the second bus bar electrode 24, it is possible to prevent the wiring member 2 from contacting the tip portion 22a of the second finger electrode 22 and the tip portion 21a of the first finger electrode 21 and causing a short circuit.

The thickness of the tip portion 21a of the first finger electrode 21 and the thickness of the tip portion 22a of the second finger electrode 22 may range from ½ to ¾ times the thickness of the base portions 21b and 22b. The thickness of the base portion 21b and 22b may range from 20 μm to 40 μm approximately. Moreover, as illustrated in FIG. 2, the width of the first and second finger electrodes 21 and 22 in the x direction is approximately uniform along the direction (y direction) in which the first and second finger electrodes 21 and 22 extend.

In the present disclosure, each of the first and second finger electrodes 21 and 22 and the first and second bus bar electrodes 23 and 24 may at least partially include a plated film. In the present embodiment, the first and second finger electrodes 21 and 22 and the first and second bus bar electrodes 23 and 24 include plated films comprising Cu. However, the first and second finger electrodes 21 and 22 and the first and second bus bar electrodes 23 and 24 are not limited to such examples, but each may include a stack of plated films. Specifically, for example, each of the first and second finger electrodes 21 and 22 and the first and second bus bar electrodes 23 and 24 may include a stack of a first plated film comprising Cu and a second plated film comprising Sn.

The example has been described in the above embodiment where the conductivity type of the substrate 11 is an n-type, but the conductivity type of the substrate 11 may be a p-type.

While the foregoing has described one or more embodiments and/or other examples, it is understood that various modifications may be made therein and that the subject matter disclosed herein may be implemented in various forms and examples, and that they may be applied in numerous applications, only some of which have been described herein. It is intended by the following claims to claim any and all modifications and variations that fall within the true scope of the present teachings.

The invention claimed is:

1. A solar cell module comprising:
a plurality of solar cells each having a light receiving surface and a back surface; and
wiring members electrically connecting the plurality of solar cells,
wherein each of the plurality of solar cells comprises:
a first bus bar electrode disposed on a first end portion of the back surface of the solar cell, and to which a first wiring member is connected;
a second bus bar electrode disposed on a second end portion of the back surface of the solar cell, and to which a second wiring member is connected;
a plurality of first finger electrodes disposed on the back surface of the solar cell, electrically connected to the first bus bar electrode, and extending in a first direction toward the second bus bar electrode; and
a plurality of second finger electrodes disposed on the back surface of the solar cell, electrically connected to the second bus bar electrode, and extending in a second direction toward the first bus bar electrode, wherein
the plurality of first finger electrodes and the plurality of second finger electrodes are alternately disposed in a direction substantially perpendicular to the first direction and the second direction,
each of the plurality of first finger electrodes has a thickness that decreases as a distance to the second bus bar electrode decreases,
each of the plurality of second finger electrodes has a thickness that decreases as a distance to the first bus bar electrode decreases, and
the first wiring member is connected to the first bus bar electrode by a first adhesive layer, wherein the first wiring member overlaps with the first bus bar electrode, the plurality of first finger electrodes, and the plurality of second finger electrodes in a direction orthogonal to the back surface of the solar cell and wherein the first adhesive layer is disposed between the first wiring member and the first bus bar electrode and is disposed between the first wiring member and a part of the back surface on an opposite side from the first and second finger electrodes with respect to the first bus bar electrode and wherein the first adhesive layer is further disposed between the first wiring member and the plurality of second finger electrodes such that no direct contact is provided between the first wiring member and the plurality of second finger electrodes.

2. The solar cell module according to claim 1,
wherein each of the first bus bar electrode, the second bus bar electrode, the plurality of first finger electrodes, and the plurality of second finger electrodes at least partially includes a plated film.

3. The solar cell module according to claim 1,
wherein the second wiring member is connected to the second bus bar electrode by a second adhesive layer, wherein the second adhesive layer is disposed between the second wiring member and the plurality of first finger electrodes.

4. A solar cell having a light receiving surface and a back surface, the solar cell comprising:
a first bus bar electrode disposed on a first end portion of the back surface and to which a first wiring member is connected;
a second bus bar electrode disposed on a second end portion of the back surface and to which a second wiring member is connected;
a plurality of first finger electrodes disposed on the back surface, electrically connected to the first bus bar electrode, and extending in a first direction toward the second bus bar electrode; and
a plurality of second finger electrodes disposed on the back surface, electrically connected to the second bus bar electrode, and extending in a second direction toward the first bus bar electrode, wherein
the plurality of first finger electrodes and the plurality of second finger electrodes are alternately disposed in a direction substantially perpendicular to the first direction and the second direction,
each of the plurality of first finger electrodes has a thickness which decreases as a distance to the second bus bar electrode decreases,
each of the plurality of second finger electrodes has a thickness which decreases as a distance to the first bus bar electrode decreases, and
the first wiring member is connected to the first bus bar electrode by a first adhesive layer, wherein the first wiring member overlaps with the first bus bar electrode, the plurality of first finger electrodes, and the plurality of second finger electrodes in a direction orthogonal to the back surface of the solar cell and wherein the first adhesive layer is disposed between the first wiring member and the first bus bar electrode and is disposed between the first wiring member and a part of the back surface on an opposite side from the first and second finger electrodes with respect to the first bus bar electrode and wherein the first adhesive layer is further disposed between the first wiring member and the plurality of second finger electrodes such that no direct contact is provided between the first wiring member and the plurality of second finger electrodes.

5. The solar cell according to claim 4,
wherein the second wiring member is connected to the second bus bar electrode by a second adhesive layer, wherein the second adhesive layer is disposed between the second wiring member and the plurality of first finger electrodes.

6. A solar cell module comprising:
a first solar cell and a second solar cell, each of which comprises a light receiving surface and a back surface; and
a wiring member electrically connecting the first and second solar cells, wherein each solar cell comprises:

a first bus bar electrode disposed on a first end portion of the back surface of the solar cell;

a second bus bar electrode disposed on a second end portion of the back surface of the solar cell;

a plurality of first finger electrodes disposed on the back surface of the solar cell, electrically connected to the first bus bar electrode, and extending in a first direction toward the second bus bar electrode; and a plurality of second finger electrodes disposed on the back surface of the solar cell, electrically connected to the second bus bar electrode, and extending in a second direction toward the first bus bar electrode, wherein the plurality of first finger electrodes and the plurality of second finger electrodes are alternately disposed in a direction substantially perpendicular to the first direction and the second direction, each of the plurality of first finger electrodes has a thickness that decreases as a distance to the second bus bar electrode decreases, each of the plurality of second finger electrodes has a thickness that decreases as a distance to the first bus bar electrode decreases, the wiring member is connected to the first bus bar electrode of the first solar cell by a first adhesive layer, wherein the wiring member overlaps with the first bus bar electrode, the plurality of first finger electrodes, and the plurality of second finger electrodes in a direction orthogonal to the back surface of the first solar cell and wherein the first adhesive layer is disposed between the first wiring member and the first bus bar electrode and is disposed between the first wiring member and a part of the back surface on an opposite side from the first and second finger electrodes with respect to the first bus bar electrode and wherein the first adhesive layer is further disposed between the wiring member and the plurality of second finger electrodes of the first solar cell such that no direct contact is provided between the wiring member and the plurality of second finger electrodes of the first solar cell, and the wiring member is connected to the second bus bar electrode of the second solar cell by a second adhesive layer, wherein the wiring member overlaps with the second bus bar electrode, the plurality of second finger electrodes, and the plurality of first finger electrodes in a direction orthogonal to the back surface of the second solar cell, and wherein the second adhesive layer is disposed between the wiring member and the second bus bar electrode and is disposed between the wiring member and a part of the back surface on an opposite side from the first and second finger electrodes with respect to the second bus bar electrode and wherein the second adhesive layer is further disposed between the wiring member and the plurality of first finger electrodes of the second solar cell such that no direct contact is provided between the wiring member and the plurality of first finger electrodes of the second solar cell.

7. The solar cell module according to claim 1, wherein a distance between the first wiring member and the plurality of second finger electrodes in the direction orthogonal to the back surface is greater than a distance between the first wiring member and the plurality of first finger electrodes in the direction orthogonal to the back surface.

8. The solar cell module according to claim 3, wherein a distance between the second wiring member and the plurality of first finger electrodes in the direction orthogonal to the back surface is greater than a distance between the second wiring member and the plurality of second finger electrodes in the direction orthogonal to the back surface.

9. The solar cell module according to claim 3, wherein the second wiring member overlaps with the second bus bar electrode, the plurality of second finger electrodes, and the plurality of first finger electrodes in the direction orthogonal to the back surface of the solar cell, and the second adhesive layer is provided between the second wiring member and the plurality of first finger electrodes such that no direct contact is provided between the second wiring member and the plurality of first finger electrodes.

10. The solar cell module according to claim 1, wherein the first bus bar electrode is in a direct contact with the first wiring member.

11. The solar cell module according to claim 9, wherein the second bus bar electrode is in a direct contact with the second wiring member.

\* \* \* \* \*

UNITED STATES PATENT AND TRADEMARK OFFICE
CERTIFICATE OF CORRECTION

PATENT NO.          : 10,290,749 B2  
APPLICATION NO.     : 15/271224  
DATED               : May 14, 2019  
INVENTOR(S)         : Youhei Murakami and Kenji Ikeda It is certified that error appears in the above-identified patent and that said Letters Patent is hereby corrected as shown below:

On the Title Page

Item (73) the Assignee's name should be corrected to show:  
Panasonic Intellectual Property Management Co., Ltd.

Signed and Sealed this  
Thirtieth Day of July, 2019

Andrei Iancu  
*Director of the United States Patent and Trademark Office*